United States Patent
Langereis et al.

(10) Patent No.: US 8,401,513 B2
(45) Date of Patent: Mar. 19, 2013

(54) PROXIMITY SENSOR, IN PARTICULAR MICROPHONE FOR RECEPTION OF SOUND SIGNALS IN THE HUMAN AUDIBLE SOUND RANGE, WITH ULTRASONIC PROXIMITY ESTIMATION

(75) Inventors: Geert Langereis, Eindhoven (NL); Twan van Lippen, Bladel (NL); Peter Dirksen, Valkenswaard (NL); Frank Pasveer, Dordrecht (NL)

(73) Assignee: NXP B.V., Eindhoven (NL)

( * ) Notice: Subject to any disclaimer, the term of this patent is extended or adjusted under 35 U.S.C. 154(b) by 239 days.

(21) Appl. No.: 12/828,482

(22) Filed: Jul. 1, 2010

(65) Prior Publication Data

US 2011/0003614 A1    Jan. 6, 2011

(30) Foreign Application Priority Data

Jul. 2, 2009 (EP) .................................. 09164437

(51) Int. Cl.
*H04M 9/00* (2006.01)

(52) U.S. Cl. ...................... 455/401; 455/569.1; 381/369; 381/174; 367/118; 367/95; 379/420.01

(58) Field of Classification Search .................. 455/401, 455/569.1, 569.2, 550.1; 381/369, 174; 367/118, 367/87, 95, 96, 99; 379/418, 419, 420.01–420.04
See application file for complete search history.

(56) References Cited

U.S. PATENT DOCUMENTS

| | | | |
|---|---|---|---|
| 5,619,476 A | 4/1997 | Haller | |
| 5,870,482 A | 2/1999 | Loeppert et al. | |
| 5,884,156 A | 3/1999 | Gordon | |
| 6,542,436 B1 | 4/2003 | Myllyla | |
| 2004/0253994 A1 | 12/2004 | Lampl et al. | |
| 2005/0018864 A1 | 1/2005 | Minervini | |
| 2008/0252595 A1 | 10/2008 | Boillot | |
| 2008/0317260 A1* | 12/2008 | Short | 381/92 |
| 2009/0149202 A1* | 6/2009 | Hill et al. | 455/456.6 |
| 2010/0278008 A1* | 11/2010 | Ammar | 367/7 |

(Continued)

FOREIGN PATENT DOCUMENTS

| | | |
|---|---|---|
| DE | 43 23 134 C1 | 6/1994 |
| DE | 102 08 096 A1 | 4/2003 |

(Continued)

OTHER PUBLICATIONS

Jang, et al.: "Identification and Distance Detection for Ultrasonic Sensor by Correlation Method," Proc. of the 17th World Congress, the Int'l Fed'n of Automatic Control, pp. 7534-7538 (Jul. 2008).

(Continued)

*Primary Examiner* — Ajit Patel
(74) *Attorney, Agent, or Firm* — Kramer & Amado P.C.

(57) ABSTRACT

Proximity sensor, particularly for usage in an electronic mobile device, comprising at least one acoustic transducer adapted for receiving acoustic signals at least in parts of the frequency range of human audible sound and emitting and/or receiving ultrasonic signals for proximity estimation. The acoustic transducer preferably is a Micro-Electro-Mechanical-Systems (MEMS) microphone. Further, a method in an electronic device comprising an acoustic transducer is provided comprising the steps of generating at least one electric signal in the frequency range of ultrasonic sound, emitting at least one ultrasonic signal by means of the acoustic transducer; receiving at least one ultrasonic signal by means of the acoustic transducer; deducing from the at least one emitted ultrasonic signal and the at least one received ultrasonic signal at least the delay between emission of the emitted ultrasonic signal and reception of the corresponding ultrasonic signal.

17 Claims, 3 Drawing Sheets

U.S. PATENT DOCUMENTS

2011/0017545 A1* 1/2011 Pompei .................. 181/296

FOREIGN PATENT DOCUMENTS

JP 2003-018696 A 1/2003
WO 2008/111011 A2 9/2008

OTHER PUBLICATIONS

Scheeper, et al.: "Fabrication of Silicon Condenser Microphone using Single Wafer Technology," J. of Microelectromechanical Systems, vol. 1, No. 3, pp. 147-154 (Sep. 1992).

Pedersen, et al.: "An Integrated Silicon Capacitive Microphone with Frequency Modulated Digital Output," Sensors and Actuators A69, pp. 267-275 (1998).

Neumann Jr., et al.: "CMOS MEMS Membrane for Audio Frequency Acoustic Actuation," Sensors and Actuators, A 95, pp. 175-182 (2002).

European Search Report for Patent Appln. No. 09164437.7 (Jan. 26, 2010).

* cited by examiner

PROXIMITY SENSOR, IN PARTICULAR MICROPHONE FOR RECEPTION OF SOUND SIGNALS IN THE HUMAN AUDIBLE SOUND RANGE, WITH ULTRASONIC PROXIMITY ESTIMATION

This application claims the priority under 35 U.S.C. §119 of European patent application no. 09164437.7, filed on Jul. 2, 2009, the contents of which are incorporated by reference herein.

FIELD OF THE INVENTION

The present invention in general relates to an acoustic transducer for estimating the distance or position of an electronic device relative to the user. In particular, the present invention relates to usage of a Micro-Electro-Mechanical-Systems (MEMS) microphone for reception of sound signals in the human audible sound range on one hand and emitting and/or receiving ultrasonic signals for proximity estimation on the other hand.

BACKGROUND OF THE INVENTION

Electronic devices, especially handheld devices, are getting smarter and smarter. For instance, the equipment or device is able to anticipate activities of the user thus instead of the user having to operate the device in order to adjust its settings to a new situation and/or position, "intelligent" functions, often featured by sensors, automatically adjust the settings of the device. For example, handheld devices are known having displays the content displayed on which rotates when the device is being rotated. Besides enabling features like this, sensing of the usage may especially essential for power saving mechanisms. Since battery lifecycle and standby time are critical properties among mobile devices, a standard procedure to automatically execute is switching off the display and keypad illumination of a mobile phone during a call, since a phone which is held next to a user's ear does not need a powered display. In view of that, it is essential to detect the actual situation of usage of the phone.

Known mobile phones generally comprise a keypad for making inputs to the phone, a display for visual feedback from the phone to the user, a processor for running the operation system and processing all the featured operations, storage means (e.g. RAM/ROM) for storing data of the operation system and other data, at least one loudspeaker (sometimes called receiver) for signalling of ringtones as well as for outputting of the other party's voice and at least one microphone for reception of the users voice, respectively, during a conversation, and at least one antenna for sending and receiving of electro-magnetic signals.

Recently, other features have become standard elements of mobile phones, such as photo and video camera, short-range-radio-data-exchange means, internet-browser, email client, hands-free-call capability etc., and thus, more and more different usage situations occur for the devices.

Four typical user scenarios for usage of a mobile phone are depicted in FIG. 1 denoted by a) to d). In situation a) the mobile phone is in front of the user's head, while the user is watching the display. In this situation the user can navigate through the mobile phone's menu, look for certain functions or browse through the internet, if featured. Another typical situation where the depicted position of the mobile phone is likely to occur is when due to an incoming call, the user is about to answer the call. In these situations neglecting single fingers of the user on the keypad, the front of the mobile phone is generally uncovered and since the user is interacting with the mobile phone, the illumination of the display is on.

In situation b) the mobile phone is at a user's ear, which is the normal position of a mobile phone during a call, i.e. hand-held use situation. In this use situation the front side of the mobile phone, in particular the portion or part containing the loudspeaker, is pressed against a user's ear. Since the user cannot look at the display anyway, the illumination of the display and the keypad may be turned off. In case the phone comprises a touch screen, the input function should also disabled in order to prevent the user's ear from inadvertently causing unwanted inputs to the phone. After terminating the call, the mobile phone may be positioned according to situation a), and the user will be watching the display of the mobile phone again in order to browse the menu, look up names or addresses, start another call or simply lock the keypad for example.

In situation c) the mobile phone is put on a horizontal surface, e.g. a table or desk, which is likely to occur, when the mobile phone is used for a hands-free call and the loudspeaker is driven at high volumes, i.e. a hands-free use situation. Users present during such call situations are able to look at the display of the mobile phone, browse through the menu and make inputs into the mobile phone, for example. In case of a video call, moving images of the dialogue partner, documents, or presentations might be displayed on the display of the mobile phone, which display is to be illuminated in this situation. Regardless occasional key pad inputs, the front of the mobile phone, especially the region where the loudspeaker is located, remains generally uncovered.

Situation d) shows the mobile phone in the user's pocket. This is the normal standby situation where no interaction from the user with the mobile phone is taking place, and thus the display illumination may be switched off.

Last but not least a not depicted situation, which is similar to situation d), is a mobile phone put on a table or elsewhere in the standby mode.

One sensor applicable to distinguish some of the mobile devices' actual positions is a proximity sensor, which measures some of the clues for the user scenario. The proximity sensor may detect an object, e.g. a human's head or ear, table-top etc., in front of the user interface of the phone. Additionally, a gravitational force sensor, i.e. accelerometer, can provide the horizontal or vertical position of the phone as a further clue. However, neither the proximity sensor nor the gravitational force sensor is capable to detect, whether the phone is held next to the ear during a call or in front of a face to watch the display.

Known concepts to cope with the challenge of detecting the usage situation of mobile devices are to provide light sensors and/or ultrasonic actuators/sensors in such devices. If the mobile device is held at a user's ear or head, the light sensor is exposed to less light and/or the distance to the user's cheek or head measured by the ultrasonic sensors falls below a certain threshold value, respectively and thus the display is switched off.

Smart features such as proximity estimation, however, are not limited to mobile devices. Voice control capability is expected to become more present in electronic devices in general in order to enable quick, easy and intuitive interaction with the user. This requires existence of at least one voice reception element such as a microphone in the electronic device to be voice-controlled.

U.S. Pat. No. 6,542,436 discloses a single speaker-single microphone detection arrangement for detecting if an object is in proximity to the device. Audio transducers already found in the device are used to realize the detection function, along with digital signal processing or equivalent means. For the proximity sensing a measurement signal is generated for driving an output acoustic transducer of the device. Then an input acoustic transducer of the device is monitored to detect the measurement signal; and determining that an object is in proximity to the device based on detected alteration of the measurement signal.

U.S. Pat. No. 5,619,476 discloses an electrostatic ultrasonic transducer formed on a semiconductor substrate by micro-machining.

U.S. Pat. No. 5,870,482 discloses a solid state condenser transducer.

Since electronic devices commonly are produced in mass production, hardware and production costs are to be reduced as far as possible. Thus, expensive additional actuator/sensor arrangements for estimating the proximity of a device and voice/sound input capability significantly lower the sales margins of such devices.

WO2008/111011 describes a MEMS microphone comprising a case with an open front side; a MEMS membrane mounted on one face of a base, the base being mounted inside the case on a substantially closed side; and a mesh covering the front side, substantially transparent acoustically to at least some of a range of operating frequencies at which the microphone is sensitive.

US2008/252595 describes an apparatus for virtual navigation and voice processing. The system may include, a computer readable storage medium having computer instructions for processing voice signals captured from a microphone array, detecting a location of an object in a touchless sensory field of the microphone array, and receiving information from a user interface in accordance with the location and voice signals.

JP2003/018696 describes providing an electret capacitor microphone which can also be used as an ultrasonic sensor by enlarging the characteristics up to a high frequency band while keeping the characteristics of low frequency band without increasing the size.

SUMMARY OF THE INVENTION

The invention is defined in the accompanying claims.

According to an aspect of the invention, there is provided a proximity sensor comprising at least one acoustic transducer configured to receive acoustic signals at least in parts of the frequency range of human audible sound, and emit and receive ultrasonic signals for proximity estimation. The proximity sensor is operable to deduce from at least one emitted ultrasonic signal and at least one received ultrasonic signal at least a delay between emission of the emitted ultrasonic signal and reception of the corresponding, in particular correlating, ultrasonic signal.

An embodiment of the invention can provide an arrangement which enables sound input and omits expensive additional actuator/sensor arrangements for estimating the proximity of a device to the user.

The at least one acoustic transducer, which additionally may fulfil other functions of the electronic device, is adapted to receive acoustic signals and convert the received acoustic signals into electric signals. Thus, the term "acoustic transducer" in this document in particular denotes components also called "electro-acoustic-transducers".

The proximity sensor can be used also as a microphone for voice reception and voice control in the electronic device. In principle, embodiments of the herein proposed solution may be applied to every electronic device benefiting from a microphone and a proximity sensor such as named in the following no exhaustive list: MP3 players with recording functionality, DVD-Players, computer monitors, PDAs, laptops/notebooks, USB memory stick, digital cameras, alarm clocks etc.

A certain embodiment of usage of the proximity sensor, for example, may be a computer monitor, which may comprise four microphones with distance detection on the corners. This arrangement provides for the possibility to perform direction or angular detection of the presence of a user. The direction information may be used for acoustically focus towards this person like conference phones can do.

Another example is the integration of such microphones in the dashboard of a car. The position of a driver and/or co-driver can be detected and the microphone array can be used to implement angular sensitive voice recording. This is an advantage to reduce background noise. The ultrasonic detection of the body of the driver enables a more focused beam steering than when using conventional microphones.

DVD-Players and alarm clocks could by means of the herein proposed proximity sensor enable voice and gesture control. A user just been woken up by his or her alarm clock could stop the alarm sound or switch to "snooze-mode" by a simple motion of his hand or any one of the preceding claims appropriate acoustical comment.

According to another aspect of the invention, there is provided a method of proximity estimation in an electronic device having an acoustic transducer, in particular a Micro-Electro-Mechanical-Systems (MEMS) microphone, the method comprising generating at least one electric signal in the frequency range of ultrasonic sound, the acoustic transducer emitting at least one ultrasonic signal by means of the acoustic transducer, the acoustic transducer receiving at least one ultrasonic signal by means of the acoustic transducer, and deducing from the at least one emitted ultrasonic signal and the at least one received ultrasonic signal at least a delay between emission of the emitted ultrasonic signal and reception of the corresponding, in particular correlating, ultrasonic signal.

The basic idea of the present invention resides in using a microphone, in particular a Micro-Electro-Mechanical-Systems (MEMS) microphone, for reception of sound signals in the human audible sound range for sound input on one hand and emitting and receiving ultrasonic signals for proximity estimation on the other hand.

From U.S. Pat. No. 5,870,482 and US 2005/0018864 it is known that miniature silicon condenser microphones have many advantages over normal sized microphones, as they can be integrated with CMOS circuitry, do not need an electret. An electret is a stable dielectric material with a permanently-embedded static electric charge (which, due to the high resistance and chemical stability of the material, will not decay for hundreds of years). Since miniature silicon condenser microphones do not need an electret for electrical biasing they are easier to solder onto a printed circuit board (PCB) than the conventional electret microphones. Additionally, they have a form factor compatible with state-of-the-art hand-held device architectures and can be made by batch processing which makes the device to device variation much smaller.

Typically a condenser microphone system as depicted in FIG. 4 comprises basically four elements: a fixed, perforated backplate 41, a highly compliant, moveable membrane 42, e.g. a diaphragm, which together form the two plates of a variable air-gap capacitor, a voltage bias source (not depicted), and a buffer amplifier (not depicted). The diaphragm must be highly compliant, while the backplate must remain stationary and present a minimum of resistance to the flow of air through it.

The characteristic frequency response of a MEMS microphone is one of a second order system comprising a flat response in the audible range and a resonance outside the audible range. This resonance is determined by the effective mass of the microphone membrane and the effective spring constant ("compliance") of the membrane. The damping at resonance is determined by the acoustic holes and the air gap size. In typical MEMS microphones, the resonance peak is between 50 kHz and 150 kHz.

The resonance frequency can be used for an ultrasound application where an ultrasonic burst is emitted and the reflection is sensed afterwards. The time delay between the emitted and the reflected signal is an indication for the acoustic time of flight, which is an indication for the distance to the nearest object, which can be e.g. the head or cheek of the user. This measurement can be done with a MEMS microphone which is already available in the mobile phone as a speech recording device.

Successful measurements with a MEMS microphone with a resonance frequency at 110 kHz optimised for speech showed that an ultrasound wave can be emitted from such a device. Thus, the herein proposed solution is based on reusing a MEMS microphone device as an ultrasound and audible sound transducer.

The advantage of the MEMS microphone technology are lower resonance frequencies (<100 kHz) than those of known existing ultrasound devices (capacitive micromachined ultrasonic transducer (cMUT) and/or piezoelectric micromachined ultrasonic transducer (pMUT)) where it is above 100 kHz. The explanation for the low resonance frequency of MEMS microphones is the high compliant membrane suspended over a through-wafer hole.

The inventors have perceived that a large variety of electronic devices benefit from voice control or sound input capability on one hand and from proximity estimation and/or gesture control capability on the other hand. The groundbreaking idea is to lower hardware complexity, mounting space and manufacturing steps by using an acoustic transducer for voice and sound reception in the audible frequency range as well as for ultrasonic distance or proximity detection.

Therefore, the microphone should be located in the electronic device such that it is appropriately positioned for the ultrasonic proximity detection, i.e. roughly facing in the direction from where the user is expected to approach. Accordingly, in case of a portable device such as a mobile phone, the acoustic transducer such as a MEMS-microphone may be located at the conventional location in the lower region of the portable device facing in the same direction as the display, for example. Thus, the decision whether the device is held adjacent to a user's head/cheek/ear or not, can be made based on the time lag and/or the differences of amplitudes between the emitted and due to reflection at the user's head received ultrasonic signals at the microphone and the other microphone. Thereby, the time lag(s) indicate(s) the distance to any nearby obstacle(s) in front of the microphone. Moreover, the difference(s) of amplitude(s) of the signals may be used as indication for the consistency of the reflecting obstacle(s).

According to another embodiment of the disclosed method, in a deducing step it is signalled if certain critical values regarding the emitted and the received signal are above and/or is below a predefined threshold value. Examples for such critical values are the time lag between emission and reception of the corresponding signal, the duration since emission of an ultrasonic signal, a distance of the electronic device to a user estimated from the time difference between the emission and reception of the corresponding signal and the differences of the amplitudes of the emitted ultrasonic signal and the corresponding, ultrasonic signal. The aforementioned differences may be measured by any appropriate signal analysis operation such as correlation operation performed on the received and the emitted signal. The time shift applied for maximum correlation of both signals corresponds to the delay that the received signal has regarding the emitted signal. Other appropriate operations are known to those skilled in the art and thus not discussed in further detail herein.

According to further development means are provided for splitting a received signal in a predefined part located basically in the frequency range of human audible sound and in a predefined part located basically in the ultrasonic frequency range comprising the ultrasonic signal. This way, the proximity estimation can be performed on the ultrasonic part of the received signal without being disturbed by interference with sound signals received in the audible sound range. Similarly, the received sound signal located in the audible frequency range and its further processing is not affected by ultrasonic signals for proximity detection. A possible element for this operation is a diplexer unit which may comprise high-pass filtering means and low-pass filtering means each adapted to pass the parts of the signal above or below a respective cut-off frequency to respective outputs of the diplexer.

In one embodiment of the proximity sensor the acoustic transducer employed comprises a resonance frequency in the frequency range of ultrasound in air, preferably between 50 kHz and 150 kHz, very preferably between 100 kHz and 120 kHz.

In a further aspect of the present invention a proximity sensor arrangement is provided, comprising at least one power amplifier, at least one diplexer unit and at least one processor. The processor is being adapted to provide an electric signal in the ultrasonic frequency range and compare a received signal to the signal it has previously provided. The comparison is being performed at least regarding delay and amplitude. Additionally, at least one acoustic transducer for emission of signals in the ultrasonic frequency range and reception of acoustic signals in the audible range as well as in the ultrasonic sound range is provided.

In another embodiment, in particular the correlation of the received signal and the provided signal is determined for calculating the desired time of flight.

In another embodiment at least two acoustic transducers, as herein proposed, are provided in an electronic device. In the next years, the number of acoustic transducers employed per mobile device is expected to grow in order to enable acoustical directivity sensing, e.g. to locate a speaker or a sound source in a conferencing mode of the device. This enables angular detection of the presently speaking person by runtime delay between signals received at different distances from the speaking person and thus the device may acoustically focus towards this person like conference phones can do. Possible applications are computer monitors and dashboards of motor vehicles. Thus, the effect of ambient noise and/or motor sound on speech intelligibility of a phone call can significantly be reduced.

A particular advantageous use of the proximity sensor (arrangement) as herein proposed is in a mobile and/or portable electronic device, in particular in a mobile phone or cell(ular) phone. Since mobile phones comprise at least one microphone anyway, by providing the proximity sensor (arrangement) as herein proposed instead additional features may be implemented without the need for implementation of further hardware. The logical components in the mobile phone may be adapted to perform the required processing steps for the generation and evaluation of ultrasonic signals. Accordingly, once the proximity sensor (arrangement), e.g. during a call, is deducing that the mobile device is in a covered situation (situation b) in FIG. 1), this situation-related information can be passed to a processor of the device, which is besides other tasks in control of the device's operating system. Thus, the processor can dim the display backlight or entirely switch off the display. Additionally, if featured, a keypad illumination may be switched off and/or a touch sensitive input means of the mobile device are disabled. If the device subsequently is removed out of the proximity of for example a user's head/cheek, this information again may be forwarded to the processor, which can turn on the display and/or the touch sensitive input means of the mobile device and their respective illumination.

Another aspect of the present invention is an electronic component according to claim 14.

Accordingly, the component comprises at least one herein proposed proximity sensor (arrangement) and several terminals for electric power supply of the component, for triggering the proximity estimation and for signalling the proximity estimation result. The advantage of such a component is, that the component can easily be adapted for many different surrounding electronic circuits. Connection of the component to those electronic circuits is kept simple, because the features are realized as far as possible in the component. Thus adaptation expenses are reduced and only few terminals have to be connected. For example, two terminals may be adapted to provide power supply to the component, one terminal can be provided for triggering the component to execute the proximity estimation step and a last terminal can be provided for the signalling regarding the proximity estimation result of the component. Those skilled in the art of circuitry know how to further reduce the number of necessary terminals by alternately triggering the proximity estimation step and receiving the proximity estimation result over one and the same terminal.

The object and others is further achieved by a computer program product according to claim 15.

Accordingly, the computer program product comprises instructions adapted to when executed on a programmable processor performing the steps of the proposed method of proximity estimation in an electronic device. Hardware elements or components such as signal generator, loudspeaker(s) and/or microphone(s) and filters present in the electronic device, in which the computer program is implemented, provide the required signals to the processor as input for the computer program. In this regard, it is worth to be noted that the computer program product may be contained or embodied on a data carrier medium such as the following not exhaustive examples, a hard disk, an optical disc (e.g. CD, DVD), memory key or memory stick.

Preferred embodiments and further developments of the invention are defined in the dependent claims of the independent claims. It shall be understood that the apparatuses and the method of the invention have similar and/or identical preferred embodiments and advantages.

BRIEF DESCRIPTION OF THE DRAWINGS

The present invention is further elucidated by the following figures and examples which are not intended to limit the scope of the invention. The person skilled in the art will understand that various embodiments may be combined.

These and other aspects of the invention will be apparent from and elucidated with reference to the embodiment(s) described hereinafter. In the following drawings, the figures are schematically drawn and not true to scale, and identical reference numerals in different figures, if any, may refer to corresponding elements. It will be clear for those skilled in the art that alternative but equivalent embodiments of the invention are possible without deviating from the true inventive concept, and that the scope of the invention is limited by the claims only.

DETAILED DESCRIPTION OF EMBODIMENTS

Figure 1:
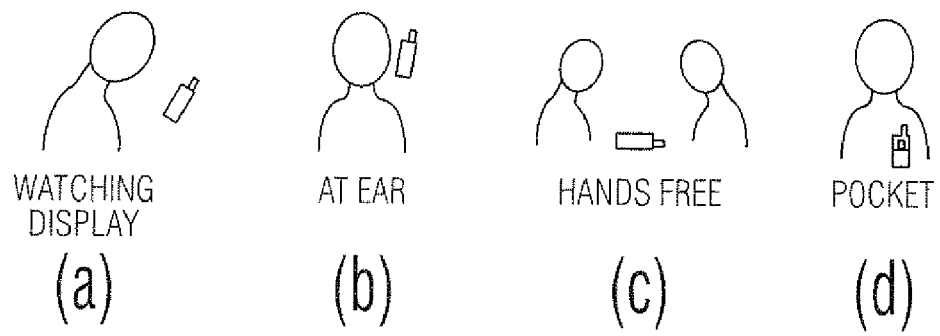
FIG. 1 illustrates four (a to d) typical user scenario's of usage of a mobile phone.
Figure 2:
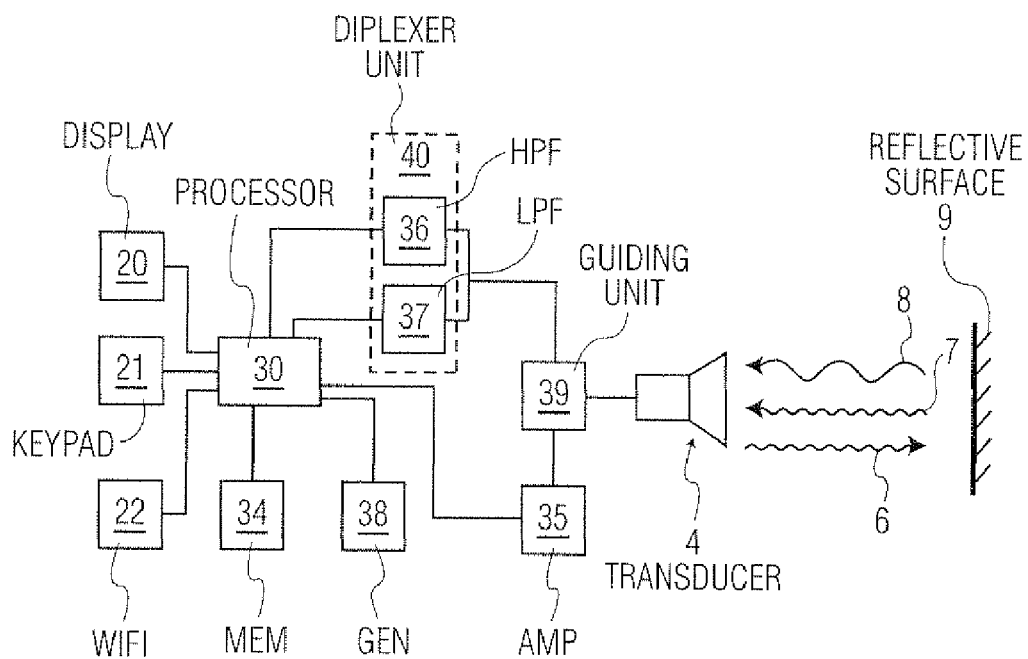
FIG. 2 shows a block diagram of the basic elements of an apparatus according to the present invention.

Now reference is made to FIG. 2, which shows a block diagram of the basic elements of a proximity sensor according to one aspect of the present solution. A signal generator 38 provides a signal in the ultrasonic sound range, preferably a burst, to processor 30. If processor 30 decides to initiate the proximity estimation step, it passes the received ultrasonic signal burst from signal generator 38 to power amplifier 35. Power amplifier 35 passes the ultrasonic signal burst to guiding unit 39, which guides the signal to the acoustic transducer 4. Guiding unit 39 may comprise a hybrid termination circuit or other appropriate means to alternating use acoustic transducer 4 as an emitter (actuator) in one moment and as a receiver (sensor) in another moment. Acoustic transducer 4 emits ultrasonic signal 6 and in case ultrasonic signal 6 impinges a reflective surface 9, reflected ultrasonic signal 7 again impinges on acoustic transducer 4.

Along with reflected ultrasonic signal 7 ambient sound or other audible sound signals 8 are received by acoustic transceiver 4. The received acoustic signals 7 and 8 in acoustic transducer 4 are converted into electric signals and by guiding unit 39 passed to diplexer unit 40, which may comprise high-pass filtering means 36 and low-pass filtering means 37. The object of diplexer unit 40 is to separate the electronic signals derived from audible sound signal 8 and reflected ultrasonic signal 7 and separately pass them to processor 30. The high-pass filtering means 36 and the low-pass filtering means 37 may be embodied as common RC-components, a more complex diplexer unit or may also comprise discrete filtering means comprised in processor 30, for example.

Processor 30 after reception of high-pass filtered, reflected ultrasonic signal 7 compares this signal to the generated signal regarding time lag and/or differences in amplitudes between both signals. From the time-lag of the reflected ultrasonic signal 7 the processor can determine the travelling time of the ultrasonic signal 6, 7 between emission and reception by acoustic transducer 4 and thus determine the distance between acoustic transducer 4 and the reflective surface 9. From the differences of the amplitudes of the ultrasonic signal 6 and reflected ultrasonic signal 7 processor 30 may draw conclusions regarding the properties of the reflective surface 9. By comparison with a predefined threshold value for the time lag processor 30 determines whether the electronic device is being held at the head or cheek of the user, which situation corresponds to a normal phone-call or if the electronic device is located at a certain distance from the head or cheek of the user, indicating a hands-free-call situation.

Depending on program code stored in storage 34 processor 30 may now switch off display 20, dim the illumination of keypad 21 and adjust operation mode of WiFi-module 22. The afore-mentioned external elements of the electronic device are mentioned as basic examples thereof, i.e. other functions and features maybe similarly affected by the processor. Similarly, the operation mode of sensors (e.g. gravity sensor(s), light sensor(s) etc.), Bluetooth module and software implemented routines can be adapted, preferably switched to less energy consuming modes during a call if not needed in the respective call mode.

If the location of the electronic device is changed and the travelling time (time of flight) of the ultrasonic sound signal is detected to overshoot the predefined threshold value, display 20 is by means of processor 30 switched on again, keypad 21 is illuminated and operating mode of WiFi-module 22 is switched back to normal operating mode.

It shall be noted, that the afore-explained features and functions maybe alternatively distributed or even omitted without departing from the scope of the attached claims. For example, signal generator 38 maybe omitted as an external element and its function maybe incorporated into processor 30. Further, display 20 and keypad 21 maybe embodied as a touch sensitive display and this way combined with each other. Furthermore, power amplifier 35 maybe omitted in case the signal provided by processor 30 is sufficient to be past to guiding unit 39 and subsequently to acoustic transducer 4. Storage 34 may store not only the instructions for operating of the proximity sensor according to the present invention but also data and instructions to operate the whole electronic device as well as user-specific data. Acoustic transducer 4 maybe embodied as an electrical, capacitive or electrostatic acoustic transducer, as long as it is capable of emitting and receiving ultrasonic sound signals as well as sound signals in the human audible sound range.

Since modern electronic devices are commonly manufactured in mass production micro-electro-mechanical-systems (MEMS) microphones manufactured by batch processing can significantly lower the hardware and manufacturing costs.

Figure 3:
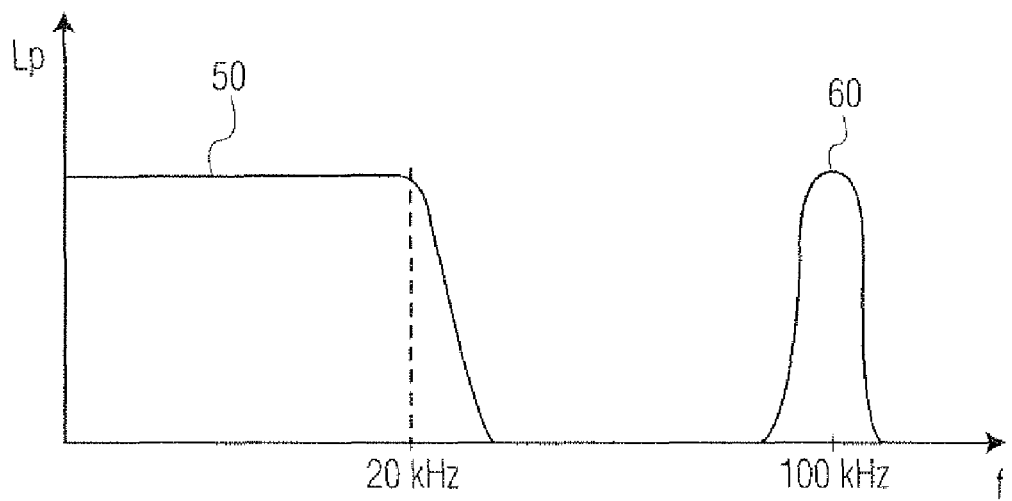
FIG. 3 is a schematic diagram of the used frequency ranges of an acoustic transducer according to the present invention.
Figure 4:
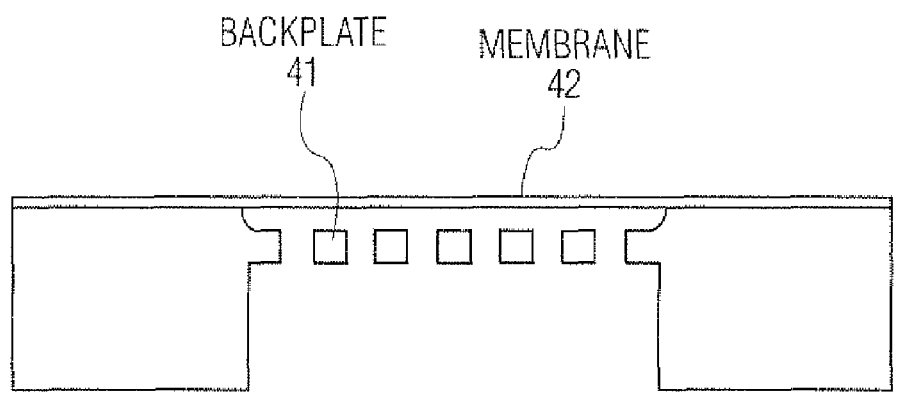
FIG. 4 illustrates the basic construction of a MEMS microphone.

Now, reference is made to FIG. 3 which is a schematic diagram depicts an exemplary frequency operating range of an acoustic transducer according to the present invention. The lower frequency range 50 reaching from low frequencies around 0 Hz to 20 kHz is used for reception of voice and other acoustic signals in the human audible sound range. The purpose of the signals received in frequency range 50 strongly depends on the kind of electronic device the proximity sensor according to the present invention is employed in. In case of a mobile phone the purpose may comprise the speech to be transmitted as well as speech commands for operating the phone. In case of a voice recorder, any audible acoustic signal such as music may be received and recorded. Frequency range 60 is located in a comparatively small frequency range e.g. around a resonance frequency of 100 kHz, which corresponds a possible resonance frequency of the acoustic transducer employed in a proximity sensor according to the present invention. Since this resonance frequency is located in the ultrasonic sound range the acoustic transducer showing the characteristic depicted in FIG. 3 is well adapted to receive sound signals and audible sound range as well as emitting and receiving signals in the ultrasonic sound range which enables proximity or distance detections of the electronic device the proximity sensor is employed in.

The gap between frequency ranges 50 and 60 remains unused. It shall be noted that the frequency characteristic shown in FIG. 3 only shows an ideal or desirable characteristic. Especially when speech signals are to be processed that downstream would be transmitted over a telephone line, frequency range 50 could be narrowed from about 300 Hz to 3.4 kHz without significant loss of signal quality. The boundaries of frequency range 60 may also vary as long as the corresponding sound waves appropriately enable the capability of proximity detection in critical distance ranges.

Figure 5:
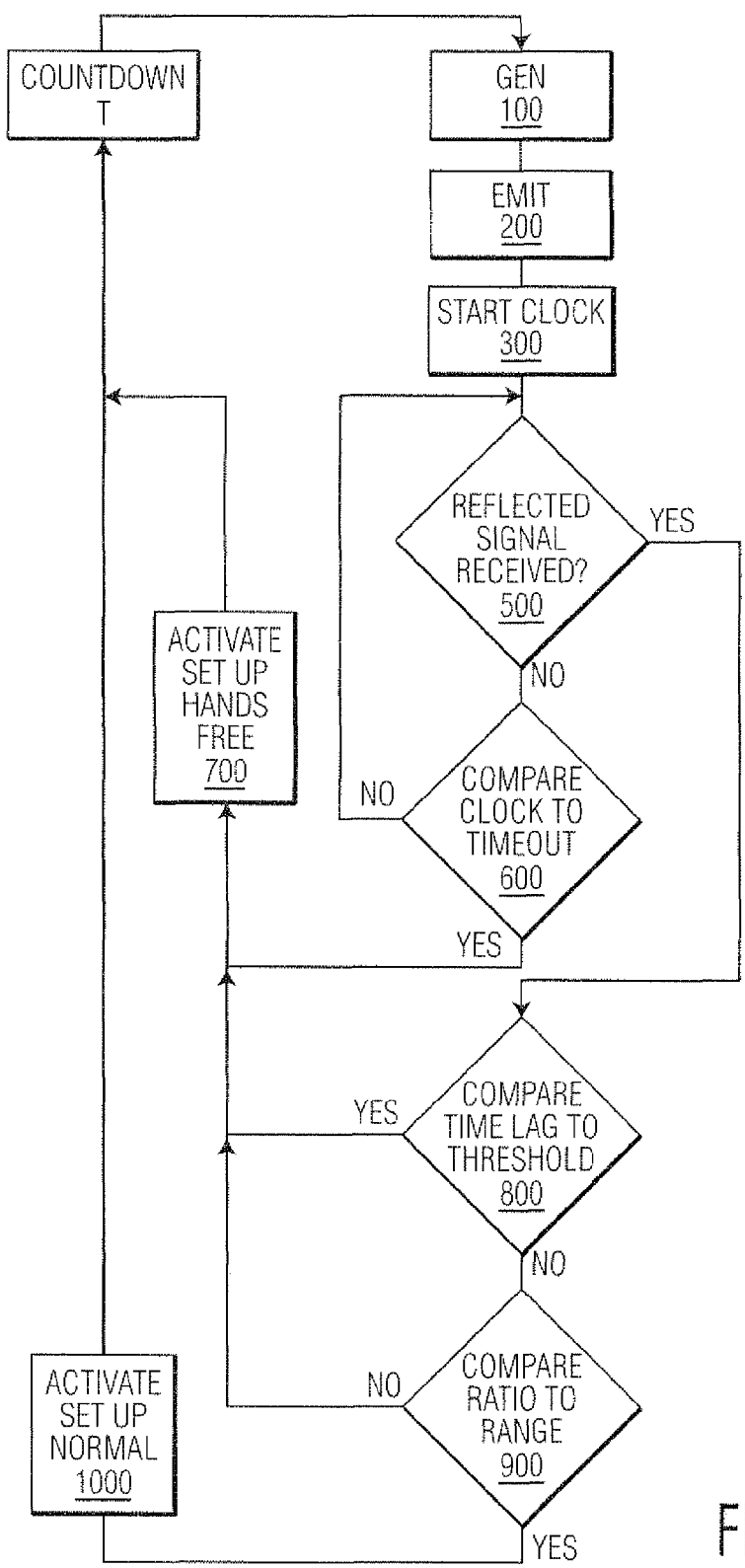
FIG. 5 depicts a flow-chart showing the basic steps of the method according to the present invention.

Finally yet importantly, the flow chart of FIG. 5 illustrates the steps to be taken in accordance with the method of the present invention, which is especially useful in handheld speech transmission devices as discussed herein above.

In step 100 an electronic signal is generated the frequency of which is in the ultrasonic sound range, preferably near the acoustic resonance frequency of the acoustic transducer employed in the embodiment of the present invention. In certain embodiments, the signal is a short burst, in order not to receive the first reflections before emission is completed. Either a distinct or separate frequency generator 38 or the processor 30 itself may generate the electronic signal.

In step 200 this signal then is emitted by the acoustic transducer.

In step 300 a clock in processor 30 is started. In this connection, any appropriate means known for estimating relevant periods of time are possible being employed.

In case in step 500 no reflected signal has yet been received, in step 600 the clock is checked for a predefined timeout value.

If in step 600 the predefined timeout value is reached, this corresponds to the situation that the emitted ultrasonic signal has not been reflected by the user's cheek, head or any other surface. In other words, the ultrasonic signal has been lost because the electronic device is in a hands-free-mode.

In step 700 the setup for hands-free-call is activated and an optional predefined dead time T is counted down until the method starts over with step 100, and the check is repeated.

In case in step 600 the predefined timeout value is not yet reached, this corresponds to the situation that the emitted ultrasonic signal is still being deemed travelling and the method continues in step 500.

In case in step 500 a reflected signal has already been received, the method continues at step 800.

In step 800 the time lag between emission and reception of the ultrasonic sound burst is compared to a corresponding predefined threshold value, if being longer than the predefined threshold value. This check is to estimate whether the electronic device is being pressed at the user's head or is positioned e.g. in front of the user.

In case the time lag is longer than the corresponding predefined threshold value, again in step 700 the setup for handy-free-call is activated and an optional timer T is started until the method starts over with step 100.

In case the time lag (or "delay") is shorter than the corresponding predefined threshold value, in step 900 the ratio of values corresponding to the amplitudes of the reflected signal and the sent signal is compared to a corresponding predefined range of values. This range of values represents ratios of amplitudes that correspond to the damping characteristics of human skin, in particular to those of the human cheeks. This way, a plausibility check is possible regarding the reflective surface, the emitted ultrasonic sound signal has been reflected at. So, in case in step 900 the ratio is detected to be below or above said predefined range of values, the signal is being deemed to having been reflected by any other reflective surface than the users head. Consequently, the phone cannot be held at the head of the user and thus in step 700 the call setup is switched to an operating mode where the display is enabled.

In case, in step 900 the ratio is within said predefined range of values, the signal is being deemed to having been reflected by the users head and subsequently in step 1000 the setup for normal-call operating mode is activated where the display is switched on and a predefined dead time T is counted down until the method starts over with step 100.

In this context it will be appreciated that that the actual implementation of the user-modes is not a subject of the herein proposed solution(s). For example, in one particular implementation, one can decide to enable the buttons and display only when an object is detected at a predetermined distance range, e.g. between 20 cm and 50 cm. Only in that case, it is considered as being likely somebody is using the interface. In another implementation, one may only want to detect an object in the vicinity of the display and buttons, when apparently nobody is able to use the interface. It goes without saying that improvements to the scenario selection algorithm can be made by using more sensors, like acceleration sensors.

It is further worth to be noted that the above-described proximity sensor arrangement preferably is operating during a call, but is not limited thereto.

Technically, it is feasible to superpose the ultrasound send-receive-measurement on top of the low-frequency audio speech signal by means of frequency multiplexing. An alternative arrangement is to use time multiplexing in which the audio recording is stopped for some tens of milliseconds to conduct the ultrasound send-receive-measurement. For the human ear, a silence in music or speech of 10 ms is not perceived as a audible glitch.

Although in particular the operating mode e.g. of display 20 and keypad 21 are of particular interest when the user is operating the mobile phone, several situations are imaginable, where the determination of the mobile phone's position relative to the user is of interest even if the user is not directly interacting with the phone. For example, in the situation, that the phone is detected to be located in the hand or in the pocket of the user, routines like checking for new messages or emails can be executed at a higher rate than in a situation where the mobile phone is detected to be located for example, on a desk in the stand-by mode.

It will be easily understood, that based on the information provided by the proximity sensor arrangement and the method according to the present invention, several other functions can be activated/deactivated in order to adjust the mobile phone to the respective situation and its position. One example is the volume adjustment of the ringtone and other notifying sounds as well as disabling energy consuming screensavers. Another example is switching off the WiFi-function, if featured, in order to lower the electro-smog exposition of the users head.

Summarizing, a proximity sensor, particularly for usage in an electronic mobile device 1 is provided, comprising at least one acoustic transducer 4 adapted for receiving acoustic signals 8 at least in parts of the frequency range of human audible sound and emitting and/or receiving ultrasonic signals 6, 7 for proximity estimation. The acoustic transducer preferably is a Micro-Electro-Mechanical-Systems (MEMS) microphone.

Furthermore a method in an electronic device 1 comprising an acoustic transducer 4 is provided comprising the steps of a method comprising the steps of generating 100 at least one electric signal in the frequency range of ultrasonic sound, emitting 200 at least one ultrasonic signal 6 by means of the acoustic transducer; receiving at least one ultrasonic signal 7 by means of the acoustic transducer; deducing 800 from the at least one emitted ultrasonic signal and the at least one received ultrasonic signal at least the delay between emission of the emitted ultrasonic signal and reception of the corresponding ultrasonic signal.

While the invention has been illustrated and described in detail in the drawings and foregoing description, such illustration and description are to be considered illustrative or exemplary and not restrictive; it is to be understood that the invention is not limited to the disclosed embodiments, but, on the contrary, is intended to cover various modifications and equivalent arrangements included within the scope of the appended claims. In particular, it shall be understood that if the term "microphone" is used, generally an acoustic transducer also capable to act as a loudspeaker might be employed. For example, an acoustic transducer in one moment can operate as a microphone and subsequently or simultaneously can operate as a loudspeaker. Furthermore, if in any embodiment a mobile phone is discussed, it does not mean that the features of the present invention explained in this connection are limited to mobile phones. Other variations to the disclosed embodiments can be understood and effected by those skilled in the art in practicing the claimed invention from a study of the drawings, the disclosure, and the appended claims. In the claims, the word "comprising" does not exclude other elements or steps, and the indefinite article "a" or "an" does not exclude a plurality. A single means or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A proximity sensor comprising:
at least one acoustic transducer configured to emit at least one ultrasonic signal, receive acoustic signals at least in a portion of a frequency range of human audible sound, receive at least one reflected ultrasonic signal, separate the received acoustic signals from the at least one received ultrasonic signal, and perform proximity estimation, wherein the proximity sensor is operable to deduce from both the at least one emitted ultrasonic signal and the at least one received ultrasonic signal at least a delay between emission of the at least one emitted ultrasonic signal and reception of the at least one received ultrasonic signal.

2. The proximity sensor according to claim 1, wherein the acoustic transducer comprises one of a capacitive and an electrostatic microphone.

3. The proximity sensor according to claim 1, wherein the acoustic transducer comprises a Micro-Electro-Mechanical-Systems (MEMS) microphone.

4. The proximity sensor according to claim 1, wherein the acoustic transducer has a resonance frequency in a frequency range of ultrasound.

5. A proximity sensor arrangement, comprising:
at least one power amplifier;
at least one diplexer unit;
at least one processor configured to provide an electric signal in the ultrasonic frequency range,
a comparison unit configured to compare the received ultrasonic signals to the provided electric signal at least regarding delay and amplitude, and determine a correlation of the received ultrasonic signals and the provided electric signal; and
at least one acoustic transducer as defined in claim 1.

6. The proximity sensor arrangement according to claim 5, further comprising:
a second acoustic transducer, wherein the at least one processor is further configured to evaluate signals received by the first and second acoustic transducers regarding a spatial direction the signals are received from.

7. A method of proximity estimation in an electronic device having an acoustic transducer, the method comprising:
generating at least one electric signal in a frequency range of ultrasonic sound;
the acoustic transducer emitting at least one ultrasonic signal by the acoustic transducer;
the acoustic transducer receiving both the emitted at least one ultrasonic signal and acoustic signals in a portion of a frequency range of human audible sound;
separating the received at least one ultrasonic signal from the received acoustic signals; and
deducing from the emitted at least one ultrasonic signal and the received at least one ultrasonic signal a delay between emission of the emitted at least one ultrasonic signal and reception of the received at least one ultrasonic signal.

8. The method according to claim 7, wherein said generating further comprises:
generating an electric signal, a frequency of which corresponds to an acoustic resonance frequency of the acoustic transducer.

9. The method according to claim 7, wherein said deducing further comprises:
determining whether the received at least one ultrasonic signal correlates with the emitted at least one ultrasonic signal; and
estimating a distance of the electronic device from a time lag between emission of the emitted at least one ultrasonic signal and reception of the correlating at least one ultrasonic signal.

10. The method according to claim 7, wherein said deducing further comprises:
evaluating differences of the amplitudes of the emitted at least one ultrasonic signal and the correlating at least one ultrasonic signal.

11. The method according to claim 7, wherein said deducing further comprises:
signaling whether a time lag between emission and reception of the respective at least one ultrasonic signals are above and/or are below a predefined threshold value.

12. The method according to claim 7, wherein the method further comprises:
splitting a received signal in a predefined part substantially located in the frequency range of human audible sound and in a predefined part located in the ultrasonic frequency range comprising the ultrasonic signal.

13. A mobile phone comprising the proximity sensor according to claim 1.

14. A computer program product, embodied on a non-transitory, computer-readable medium, comprising instructions adapted to cause a programmable processor, when executed on the programmable processor, to perform the steps of the method according to claim 7.

15. A mobile phone comprising the proximity sensor arrangement according to claim 5.

16. The proximity sensor according to claim 1, wherein the acoustic transducer has a resonance frequency in a frequency range between 50 kHz and 150 kHz.

17. The proximity sensor according to claim 1, wherein the acoustic transducer has a resonance frequency in a frequency range between 100 kHz and 120 kHz.

* * * * *